United States Patent
DeSousa

(10) Patent No.: US 10,601,327 B2
(45) Date of Patent: Mar. 24, 2020

(54) ISOLATED DC/DC CONVERTER AND METHOD FOR CONVERTING VOLTAGE WITH AN ISOLATED DC/DC CONVERTER

(71) Applicant: Valeo Siemens eAutomotive France SAS, Cergy (FR)

(72) Inventor: Luis DeSousa, Eragny sur Oise (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 0 days.

(21) Appl. No.: 15/519,019

(22) PCT Filed: Oct. 16, 2015

(86) PCT No.: PCT/FR2015/052781
§ 371 (c)(1),
(2) Date: Apr. 13, 2017

(87) PCT Pub. No.: WO2016/059353
PCT Pub. Date: Apr. 21, 2016

(65) Prior Publication Data
US 2017/0222567 A1    Aug. 3, 2017

(30) Foreign Application Priority Data
Oct. 16, 2014    (FR) .................................... 14 59951

(51) Int. Cl.
*H02M 3/335*    (2006.01)
*H02K 1/02*    (2006.01)
(Continued)

(52) U.S. Cl.
CPC .......... *H02M 3/33569* (2013.01); *H02K 1/02* (2013.01); *H02M 3/06* (2013.01);
(Continued)

(58) Field of Classification Search
None
See application file for complete search history.

(56) References Cited

U.S. PATENT DOCUMENTS 5,754,413 A * 5/1998 Fraidlin ............ H02M 3/33569
363/16
6,160,374 A * 12/2000 Hayes ..................... H02J 7/025
320/108

(Continued)

FOREIGN PATENT DOCUMENTS

FR    1458573    11/1966
WO    02077738 A1    10/2002

OTHER PUBLICATIONS

Search Report for French Application No. 1459951 dated Jun. 4, 2015.

*Primary Examiner* — Jeffrey A Gblende
(74) *Attorney, Agent, or Firm* — McCormick, Paulding & Huber PLLC

(57) ABSTRACT

The invention relates to an isolated DC/DC converter (1) comprising: —a first branch (A) comprising series-connected switches (MA1, MA2), the first branch (A) being connected to the input of the converter; —a second branch (B) comprising series-connected switches (MB1, MB2); —an inductance (L2) connected between the midpoints of the first and the second branch (B); —a capacitor connected across the end terminals of the second branch (B); —a third branch (C) comprising a magnetic component and connected to the midpoint of the second branch (B); wherein a series of opening and shutting actions of the switches (MA1, MA2, MB1, MB2) converts an input voltage (Ue) into an output voltage (Uout) by means of the magnetic component.

20 Claims, 6 Drawing Sheets

(51) Int. Cl.
  *H02M 3/06* (2006.01)
  *H03K 7/08* (2006.01)
(52) U.S. Cl.
  CPC ..... *H02M 3/33523* (2013.01); *B60L 2210/10* (2013.01); *H03K 7/08* (2013.01)

(56)  References Cited

U.S. PATENT DOCUMENTS

| | | |
|---|---|---|
| 7,336,056 B1 | 2/2008 | Dening |
| 8,503,199 B1 | 8/2013 | Chapuis et al. |
| 2013/0057200 A1* | 3/2013 | Potts ................. H02M 3/33584 320/107 |
| 2013/0063981 A1* | 3/2013 | Dujic ................. H02M 1/4233 363/16 |

* cited by examiner

ISOLATED DC/DC CONVERTER AND METHOD FOR CONVERTING VOLTAGE WITH AN ISOLATED DC/DC CONVERTER

CROSS REFERENCE TO RELATED APPLICATION

This application is a National Stage application of International Patent Application No. PCT/FR2015/052781, filed on Oct. 16, 2015, which claims priority to French Patent Application No. 1459951, filed on Oct. 16, 2014, each of which is hereby incorporated by reference in its entirety.

TECHNICAL FIELD

The present invention concerns an isolated DC/DC converter, a device for converting voltage comprising a combination of converters according to the invention, and a method for converting voltage that is implemented with the converter according to the invention.

BACKGROUND

Isolated DC/DC (for direct current/direct current) converters can have zero voltage switching or ZVS or zero current switching or ZCS that allow a reduction in switching losses during voltage conversion. These converters are therefore particularly advantageous in an automotive application, where the energy resource is limited. In a vehicle, a voltage converter can be used to adapt voltage levels between a plurality of electrical systems in the vehicle or to convert a voltage between an energy source and an electrical load on board the vehicle.

An isolated DC/DC converter is known from the U.S. Pat. No. 5,754,413, which is illustrated in FIG. 1. The converter comprises two switches Q1, Q2 that have their centre point connected to a branch that comprises two transformers in series. The converter is designed as a half-bridge. The switches control the transmission of energy through the transformers in order to obtain conversion of an input voltage of the converter into an output voltage. Diodes connected to the secondaries of the transformers allow the output signal to be rectified. The output voltage is obtained by controlling the duty cycle of the switches. By modifying the duty cycle in order to attain a target output voltage value, the gain of the converter is adjusted in order to attain the target output voltage value. In particular, when the input voltage of the isolated DC/DC converter varies, it is known practice to vary the duty cycle of the switches of the isolated DC/DC converter in order to regulate its output voltage, that is to say to maintain its output voltage at a desired value.

However, the voltage stress of the rectification diodes is dependent on the duty cycle of the switches of the converter. This stress can become great when the duty cycle becomes close to 0% or 100%. In order to limit the voltage stress of the rectification diodes, the two transformers have respective transformation ratios provided, which are different. This complicates the design of the converter, however, because the transformers cannot be identical and the current in the secondary exhibits discontinuities.

Moreover, when working with a variable duty cycle, current ripples, at the output can vary greatly, bringing about a variation in the output from the converter. In order to preserve operation with a good level of output, the duty cycle must vary little. Now, in a vehicle, the voltage of an energy source, such as a battery, can vary greatly according to the energy that is available. Such variation at the input of the converter involves the duty cycle being varied in corresponding fashion, which limits the use of the isolated DC/DC converter in a vehicle.

SUMMARY

Therefore, a solution is sought in order to improve the performance of an isolated DC/DC converter so as to allow it to be used in an automotive vehicle.

In order to solve this problem, the invention concerns an isolated DC/DC converter comprising:

a first arm comprising switches in series, the first arm being connected to the input of the converter;

a second arm comprising switches in series;

an inductance connected between the centre points of the first and the second arm;

a capacitance connected between the end terminals of the second arm;

a third arm comprising a magnetic component, the third arm being connected to the centre point of the second arm;

in which successions of opening and closing operations of the switches allow an input voltage to be converted into an output voltage by means of the magnetic component.

Within the context of the present application, an isolated converter is understood to mean a converter comprising an electrical isolation barrier between functional elements of the converter. The converter can notably comprise an element allowing an energy to be transmitted through this isolation barrier.

Notably, the first arm is directly connected to the input of the isolated DC/DC converter.

The first arm, as well as the capacitance and the inductance, help to control the transfer of energy through the magnetic component. In relation to the prior art, the duty cycle of the first arm constitutes a supplementary parameter in the control of the transfer of energy through the magnetic component. Thus, an isolated DC/DC converter is obtained in which control can be refined in order to improve performance in relation to the prior art, notably as far as the transmission of energy by means of the magnetic component is concerned. According to one embodiment, the first arm is configured to control the output voltage of the isolated DC/DC converter by modifying an electrical parameter of a signal flowing in the inductance, the duty cycle of the second arm remaining substantially constant. The duty cycle of the switches of the second arm therefore remains constant to an uncertain degree.

Thus, a desired voltage value at the output of the isolated DC/DC converter is obtained by adjusting the electrical parameter of the signal flowing in the inductance. Each desired voltage value at the output of the isolated DC/DC converter has a corresponding value of the electrical parameter of the signal flowing in the inductance. A desired output voltage value at the output of the isolated DC/DC converter is obtained without modifying the duty cycle of the second arm. The duty cycle of the second arm can therefore be fixed to a value that allows a maximum output from the isolated DC/DC converter, notably for the transmission of energy through the magnetic component.

At a given output voltage of the isolated DC/DC converter, the first arm allows operation of the second arm with a constant duty cycle for any input voltage, in particular one that is in an operating range of the isolated DC/DC converter. By way of example, the difference between the minimum value and the maximum value of the input voltage of the isolated DC/DC converter is between 150 and 500 V; by way of example, the minimum value of the input voltage is between 150 and 200 V; and the maximum value of the input voltage is between 400 and 500 V, or even between 400 and 650 V.

In particular, the first arm is configured to modify the electrical parameter of the signal flowing in the inductance by modifying its own duty cycle.

According to a variant of this embodiment, the second arm is configured so that its duty cycle is substantially equal to 50%. At a duty cycle of 50% in the second arm, the current at the output of the isolated DC/DC converter, more particularly at the output of the magnetic component, exhibits ripples that are small because the ripples in the currents in magnetizing inductances of the isolated DC/DC converter, in particular those of the magnetic component, are compensated for.

According to one embodiment, the converter comprises a circuit that is intended to implement a first loop so as to restrain a setpoint for an electrical parameter of a signal flowing through the inductance connected between the first and second arms to a difference between the value of the output voltage of the isolated DC/DC converter and a setpoint output voltage for the isolated DC/DC converter.

According to a variant, the converter comprises a circuit that is intended to implement a second loop so as to restrain the electrical parameter of the signal flowing through the inductance connected between the first and second arms to a difference between the value of the electrical parameter and the setpoint of the electrical parameter.

According to a variant, the electrical parameter of the signal is a current or a voltage. Thus, in one particular variant, the circuit is intended to implement the first loop so as to restrain the current flowing through the inductance connected between the first and second arms to a difference between the value of the output voltage of the isolated DC/DC converter and a setpoint output voltage for the isolated DC/DC converter.

In particular, the circuit of the first loop and/or of the second loop restrain the electrical parameter by restraining the switches of the first arm, notably by restraining a duty cycle for opening or closing of the switches.

According to one embodiment, the magnetic component has a primary circuit and a secondary circuit that are separated by an electrical isolation barrier, said magnetic component being configured so as, during the conversion of an input voltage of the isolated DC/DC converter into an output voltage, to operate as a transformer from the primary circuit to the secondary circuit and as an impedance that stores energy in the primary circuit.

In particular, the output voltage of the isolated DC/DC converter is taken from the terminals of the secondary circuit of the magnetic component.

According to one embodiment, the magnetic component is configured so that:

over a first portion of an operating period of the converter, a first portion of the primary circuit transfers an energy to a first portion of the secondary circuit and a second portion of the primary circuit provides an inductance storing energy;

over a second portion of the operating period of the converter, the second portion of the primary circuit transfers an energy to a second portion of the secondary circuit, and the first portion of the primary circuit provides an inductance storing energy.

In particular, the second arm is controlled using pulse width modulation; the first operating period portion corresponds to a first portion of the modulation period; and the second portion of the operating period corresponds to a second portion of the modulation period. These first and second portions are notably determined by the duty cycle of the second arm.

According to a variant, the primary circuit of the magnetic component comprises a primary winding and the secondary circuit of the magnetic component comprises at least one first secondary winding and at least one second secondary winding that are not magnetically coupled to one another, said first and second secondary windings being magnetically coupled to the primary winding. It must be understood that the secondary circuit comprises at least one primary winding, at least one first primary winding and at least one second secondary winding. In particular, the primary circuit of the magnetic component comprises a single primary winding. Notably, the primary winding is connected to the centre point of the second arm.

In particular, the output voltage of the isolated DC/DC converter is taken from the terminals of the first secondary winding(s) and/or of the second secondary winding(s).

According to one particular variant, the magnetic component is configured to act firstly as a transformer from the primary winding to the secondary windings, notably from a portion of the primary winding to the secondary windings; and secondly as an impedance that stores energy in the primary winding, notably in another portion of the primary winding.

In particular, the magnetic component is configured to act as a transformer from the primary winding, notably from a portion of the primary winding, either to the first secondary winding(s) or to the second secondary winding(s); while operating as an impedance that stores energy in the primary winding, notably in another portion of the primary winding.

According to one particular variant, the secondary winding to which the magnetic component acts as a transformer is dependent on the voltage provided on the primary winding. In other words, according to the voltage provided on the primary winding, the magnetic component operates as a transformer either to the first secondary winding(s) or to the second secondary winding(s).

According to a variant, the magnetic component comprises at least a first and a second transformer in series, in which transformers:

the primary of the first transformer forms the first portion of the primary circuit and the secondary of the first transformer forms the first portion of the secondary circuit;

the primary of the second transformer forms the second portion of the primary circuit and the secondary of the second transformer forms the second portion of the secondary circuit.

In particular, the primaries of the transformers are in series and connected to the centre point of the second arm. In particular, the output voltage of the isolated DC/DC converter is taken from the terminals of the secondary(ies) of the first transformer and/or the second transformer.

According to one embodiment, the second arm and the magnetic component, notably the primary circuit of the magnetic component, form a half-bridge structure. In particular, the third arm comprising the magnetic component is connected firstly to the centre point of the second arm and secondly to an earth of the isolated DC/DC converter.

Alternatively, the second arm and the magnetic component, notably the primary circuit of the magnetic component, form a full-bridge structure with other switches. In particular, the third arm comprising the magnetic component is connected firstly to the centre point of the second arm and secondary to the centre point of a fourth arm comprising switches in series.

According to one embodiment, at least one of the switches comprises a capacitance in parallel, notably the switches of the second and/or fourth arm(s).

The invention moreover concerns a device for converting voltage comprising a combination of at least two isolated DC/DC converters according to the invention; and in which the first respective arms of the isolated DC/DC converters are configured to operate with a phase shift of $2\pi/n$, and the second respective arms of the converters are configured to operate with a phase shift of $\pi/n$, n being the number of isolated DC/DC converters.

In particular, the at least two isolated DC/DC converters of the device are interlaced.

According to one embodiment, the isolated DC/DC converters share a single circuit that is intended to implement the first loop, so that the first respective arms of the isolated DC/DC converters receive the same setpoint.

The invention likewise concerns a method for converting voltage comprising the steps involving:

providing at least one isolated DC/DC converter according to the invention;

performing successions of opening and closing operations of the switches allowing an input voltage to be converted into an output voltage by means of the magnetic component of the isolated DC/DC converter.

According to one embodiment, the performance of the successions of opening and closing operations of the switches comprises modification of an electrical parameter of a signal flowing through the inductance, the duty cycle of the second arm remaining substantially constant. The duty cycle of the switches of the second arm therefore remains constant to an uncertain degree.

In particular, the modification of an electrical parameter of a signal flowing in the inductance comprises the modification of the duty cycle of the first arm.

According to one embodiment, the duty cycle of the second arm is substantially equal to 50%.

According to one embodiment, the conversion of the input voltage into an output voltage comprises a first loop restraining the setpoint of an electrical parameter of a signal flowing through the first arm to a difference between the value of the output voltage of the isolated DC/DC converter and a setpoint output voltage for the isolated DC/DC converter.

According to one embodiment, the method comprises the provision of a plurality of isolated DC/DC converters; and the method is such that:

the second respective arms of the isolated DC/DC converters operate with a phase shift of $\pi/n$, n being the number of isolated DC/DC converters; and the first respective arms of the isolated DC/DC converters operate with a phase shift of $2\pi/n$.

According to one embodiment, the conversion of the input voltage into an output voltage is performed with the same setpoint delivered by a single first arm that is shared between the isolated DC/DC converters.

The method according to the invention can comprise one of the features described above in relation to the isolated DC/DC converter according to the invention.

BRIEF DESCRIPTION OF THE DRAWINGS

The invention will be better understood with reference to the drawings, in which.

DETAILED DESCRIPTION OF THE DRAWINGS

Figure 2:
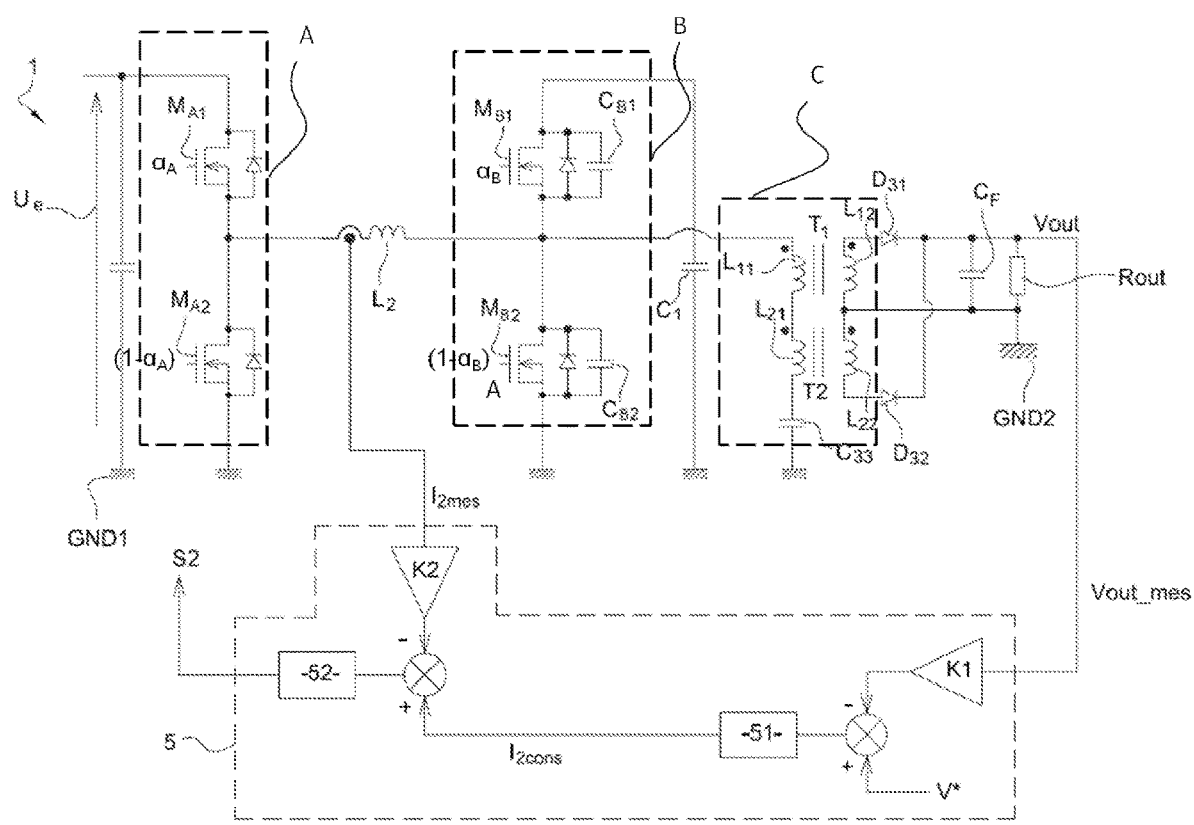
FIGS. 2 and 3 each illustrate an example of an isolated DC/DC converter according to the invention.

The converter according to the invention will be better understood with reference to FIG. 2, which presents an example of an isolated DC/DC converter according to the invention.

The isolated DC/DC converter 1 comprises a first arm A of switches in series and a second arm B of switches in series. The arms A, B comprise switches MA1, MA2, MB1, MB2, in which a succession of opening and closing operations allows the output of the isolated DC/DC converter 1 to be controlled. These switches may be transistors, such as MOSFET, IGBT or other transistors. A portion, notably the switches of the second arm, or the whole of the isolated DC/DC converter 1 can be produced from a semiconductor material such as silicon (Si), gallium nitride (GaN), silicon carbide (SiC) or any other semiconductor material.

The first arm A comprises two switches MA1, MA2 in series. The switch MA1, referred to as the high-side switch, is connected to the high terminal of a voltage source (not shown). The switch MA2, referred to as the low-side switch, is connected to the low terminal of the voltage source. This low terminal corresponds notably to a first earth GND1 of the isolated DC/DC converter 1. Each switch MA1, MA2 can comprise a transistor in parallel with a freewheeling diode.

An inductance L2 has a first terminal connected to the centre point of the two switches MA1, MA2 of the first arm A, and a second terminal connected to the centre point of the second arm B.

The second arm B comprises two switches MB1, MB2 in series, which are preferably identical. The switches MB1, MB2 comprise diodes that are similar to the diodes described above for the switches MA1, MA2 of the first arm A. Moreover, each switch MB1, MB2 comprises a capacitance CB1, CB2 in parallel. These capacitances CB1, CB2 are used for zero voltage switching or ZVS when the switches MB1, MB2 open. During the opening of a switch MB1, MB2, energy stored in an inductance, notably a leakage inductance of a magnetic component described later, is recovered in order to discharge the capacitance CB1, CB2 that is at the terminals of the switch. Once the voltage is close to 0V, the switch is controlled and thus zero voltage switching is produced, which greatly reduces switching losses. These capacitances CB1, CB2 may be inherently present in the structure of the semiconductor making up the switches MB1, MB2, as parasitic elements. The parasitic capacitances of the switches MB1, MB2 may therefore suffice for producing zero voltage switching without the addition of supplementary capacitances. The first arm A could likewise comprise capacitances for soft switching of its switches MA1, MA2. However, this would bring about current ripples in the inductance L2 that are likely to result in losses. The result of this would be that the advantage of the soft switching of the switches MA1, MA2 of the first arm A would be lost.

A capacitance C1 is connected between the end terminals of the second arm B. In particular, the capacitance C1 is connected to the high-side switch MB1 of the second arm B and to the low-side switch MB2 of the second arm, at a respective terminal that is different from the centre point of the second arm B.

The centre point between the two switches MB1, MB2 of the second arm B is connected to a third arm C that comprises two isolation transformers T1, T2 in series. Each transformer T1, T2 comprises a primary L11, L21 and a secondary L12, L22. The primaries L11, L21 and the secondaries L12, L22 are respectively in series. The centre point of the switches MB1, MB2 is connected to the primaries L11, L21. A capacitance C33 is in series with the transformers T1, T2. However, the isolated DC/DC converter 1 could do without this capacitor. The capacitance C33 allows the DC component of the signal transmitted by the transformers T1, T2 to be eliminated, notably in the case of a half-bridge structure. The capacitance C33 can be eliminated in a full-bridge structure. The secondaries L12, L22 are in series, with their centre point connected to a second earth GND2 of the isolated DC/DC converter 1.

Diodes D31, D32 are connected to the secondaries L12, L22 in order to rectify the signal from the transformers T1, T2. To this end, a diode D31 has its anode connected to a terminal of one secondary L12 and the other diode D32 has its anode connected to a terminal of the other secondary L22, these terminals being different from the centre point of the two secondaries L12, L22. The output of the isolated DC/DC converter 1 is taken between the terminal of the diodes D31, D32 that is not connected to the secondaries L12, L22 and that is common to the two diodes D31, D32 and the second earth GND2. The high output is therefore taken from the common terminal of the diodes D31, D32.

In a variant, each diode D31, D32 has its respective cathode connected to a terminal of the secondary L12, L22 that is different from the centre point. The high output is taken from the centre point of the secondaries L12, L22. The centre point of the secondaries L12, L22 is therefore not connected to the second earth GND2. The terminal that is common to the two diodes D31, D32 is connected to the second earth GND2.

The diodes D31, D32 could advantageously be replaced by switches, notably transistors, such as MOSFET, IGBT or other transistors, in order to obtain synchronous rectification at the output of the transformers T1, T2, for example. For high-current applications on the secondary, the use of transistors instead of the diodes allows the overall output from the isolated DC/DC converter 1 to be improved.

The isolated DC/DC converter 1 comprises a capacitance CF for filtering the output signal.

The switches MB1, MB2 of the second arm B have a duty cycle that allows an energy to be transferred through the transformers T1, T2. In particular, over a first portion of an operating period, the switch MB1 is closed and the switch MB2 is open. A magnetizing inductance of the primary L11 of the first transformer T1 stores energy and the primary L21 of the second transformer T2 transfers an energy to the secondary L22 of the second transformer T2.

Over a second portion of the operating period, a magnetizing inductance of the primary L21 of the second transformer T2 stores energy, and the primary L11 of the first transformer T1 transfers an energy to the secondary L12 of the first transformer T1. The durations of the first and second portions of operation are defined by the duty cycle of the switches MB1, MB2.

Figure 1:
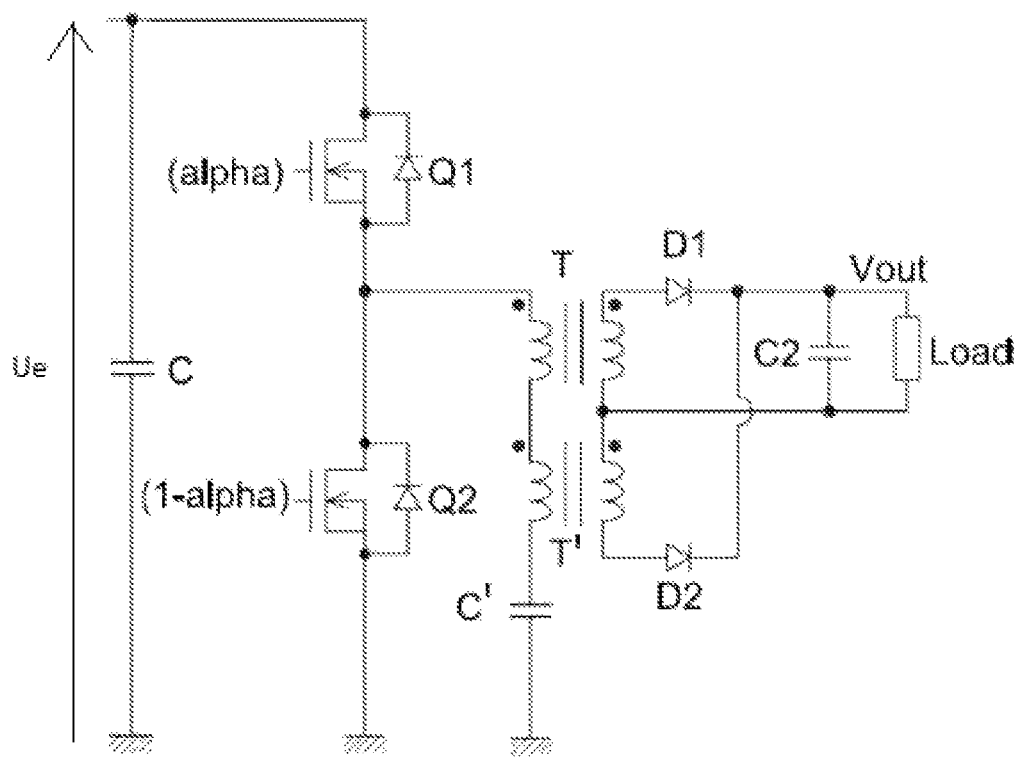
FIG. 1 illustrates an example of an isolated DC/DC converter according to the prior art.

In the prior art illustrated in FIG. 1, the transmission of energy through the transformers T1, T2 is controlled by the switches Q1, Q2 in series. In the isolated DC/DC converter according to the invention, the second arm B likewise allows this energy transmission to be controlled. However, in the prior art, the voltage at the terminals of the branch comprising the two switches Q1, Q2 is equal to the input voltage Ue of the converter. By contrast, in the isolated DC/DC converter 1 according to the invention, the voltage VC1 at the terminals of the second branch B, that is to say at the terminals of the capacitance C1, is provided by the expression $$VC1 = \frac{\alpha_A}{\alpha_B} \times Ue,$$

where $\alpha_A$ is the duty cycle of the first arm A and $\alpha_B$ is the duty cycle of the second arm B.

Thus, in the isolated DC/DC converter 1, the duty cycle $\alpha_A$ of the first arm A constitutes, in relation to the prior art, a supplementary parameter in the control of the transfer of energy trough the transformers T1, T2. Control of the isolated DC/DC converter 1 is therefore refined in relation to the prior art.

Moreover, the range of values that can be accessed by the voltage VC1 at the terminals of the second branch B is above the range of values that can be accessed by the voltage at the terminals of the branch of the switches Q1, Q2 in the prior art. The reason for this is that if the ratio $\alpha_A/\alpha_B$ is above 1, then the voltage VC1 at the terminals of the second branch B is above the input voltage Ue. In particular, the voltage VC1 may be above a maximum value $Ue_{max}$ of the input voltage Ue. The voltage VC1 at the terminals of the branch B may therefore be higher than the input voltage Ue of the isolated DC/DC converter 1, in contrast to the prior art. Equally, if the ratio $\alpha_A/\alpha_B$ is below 1, then the voltage VC1 at the terminals of the second branch B is below the input voltage Ue. In particular, the voltage VC1 may be below a minimum value $Ue_{min}$ of the input voltage Ue. The voltage VC1 at the terminals of the second branch B may therefore be lower than the input voltage Ue of the isolated DC/DC converter, in contrast to the prior art.

It may be noted that this property of lowering or raising the input voltage may be implemented by adding a supplementary stage to the converter of the prior art illustrated in FIG. 1. By way of example, the supplementary stage may be a step-up/step-down ("buck-boost") converter connected to the primary side of the converter. The converter obtained would therefore have two supplementary arms of switches in relation to the arms of switches Q1, Q2. The total number of arms of switches would therefore be 3 on the primary side of the converter. By contrast, in the converter according to the invention, the property of lowering or raising the input voltage is obtained with two arms A, B of switches MA1, MA2, MB1, MB2 on the primary side of the converter 1.

In particular, the switches MB1, MB2 of the second arm B operate with a duty cycle $\alpha_B$ that does not vary, that is to say that remains constant over the course of time. During the operation of the isolated DC/DC converter 1, the output voltage Vout is controlled by the current flowing in the inductance L2. This current is controlled by the first arm A. To this end, the isolated DC/DC converter 1 comprises a control unit 5 for the first arm A. The control unit 5 delivers a pulse width modulation or PWM signal S2 that controls the opening and closing of the switches MA1, MA2 of the first arm A in order to control the current flowing in the inductance L2. The switches MA1, MA2 of the first arm A are controlled so that the current flowing in the inductance L2 allows a desired voltage value to be obtained at the output of the isolated DC/DC converter 1. Thus, in contrast to the prior art, it is not necessary to vary the duty cycle $\alpha_B$ of the switches MB1, MB2 that are connected to the transformers T1, T2. The second arm B can therefore operate at its most advantageous duty cycle $\alpha_B$ for the transmission of energy by the transformers T1, T2, notably at 50%.

The voltage stresses at the terminals of the diodes D31, D32 are dependent on the duty cycle $\alpha_B$ of the second arm B, and are provided by the following expressions:

$$V(D31)=Vout/(1-\alpha_B) \text{ and } V(D32)=Vout/\alpha_B$$

The duty cycle $\alpha_B$ is preferably equal to 50%. Thus, the voltage stresses at the terminals of two diodes D31, D32 are equal, and the wear is the same between the diodes D31, D32. Moreover, at a duty cycle of 50%, the current ripples owing to the magnetizing inductances of the transformers T1, T2 are compensated for among one another. Thus, the current on the secondaries L12, L22 is continuous.

The voltage VC1 at the terminals of the second branch B is then equal $2\alpha_A$Ue. With the duty cycle $\alpha_A$ of the first arm A, the voltage VC1 at the terminals of the second arm B can be varied. If the duty cycle $\alpha_A$ of the first arm A is below 0.5, the voltage VC1 at the terminals of the second arm B is below 2Ue. If the duty cycle $\alpha_A$ of the first arm A is above 0.5, the voltage VC1 at the terminals of the second arm B is above 2Ue. A duty cycle $\alpha_B$ of 0.5 for the second arm B therefore allows simple control of the isolated DC/DC converter 1.

In particular, when the input voltage Ue of the voltage converter 1 varies, the first arm A makes it possible to ensure that the output voltage Vout keeps a desired value. Thus, if the input voltage Ue of the isolated DC/DC converter 1 changes value, the control unit 5 modifies the control of the duty cycles $\alpha_A$ of the switches MA1, MA2 of the first arm A in corresponding fashion in order to maintain the current flowing through the coil L2 at a desired value. This is particularly advantageous in an electric vehicle, where the level of charge of a battery can vary over the course of time.

More particularly, the control unit 5 produces a first feedback loop that restrains the current flowing through the inductance connected between the first A and second B arms to a difference between the value Vout_mes of the output voltage of the isolated DC/DC converter 1 and a desired voltage Vout at the output of the isolated DC/DC converter 1. To this end, the control unit 5 receives the voltage Vout_mes measured at the output of the isolated DC/DC converter, possibly multiplied by a gain K1. The control unit 5 then compares a setpoint voltage V* with the measured voltage Vout_mes. The setpoint voltage V* corresponds to the voltage Vout desired at the output of the isolated DC/DC converter 1. According to the result of the comparison, a controller 51 delivers to the first arm A a setpoint current I2cons that has to flow through the inductance L2.

The setpoint current I2cons can be transmitted directly to a controller 52 that delivers to the first arm A the PWM signal S2 from the setpoint current I2cons. However, the control unit 5 can produce a second loop that restrains the current flowing through the inductance L2 to a difference between the value I2mes of the current flowing through the inductance L2 and the setpoint current I2cons. In particular, the control unit 5 compares the setpoint current I2cons that is output by the first loop with the current I2mes measured on the inductance L2. The current I2cons is possibly multiplied by a gain K2 before the comparison. According to the result of this comparison, the controller 52 determines the signal S2 for controlling the duty cycle aA of the switches MAL MA2 of the first arm A so as to adjust the current flowing through the inductance L2. Voltage loops could be used. However, the current loop is easier to implement because, as a small signal, the current loop makes it possible to have a transfer function of the first order, whereas the voltage loop is of the second order. Moreover, the isolated DC/DC converter 1 could implement the first loop without using the second loop.

The setpoint current I2cons can be transmitted directly to a controller 52 that delivers to the first arm A the PWM signal S2 from the setpoint current I2cons. However, the control unit 5 can produce a second loop that enslaves the current flowing through the inductance L2 to a difference between the value I2mes of the current flowing through the inductance L2 and the setpoint current I2cons. In particular, the control unit 5 compares the setpoint current I2cons that is output by the first loop with the current I2mes measured on the inductance L2. The current I2cons is possibly multiplied by a gain K2 before the comparison. According to the result of this comparison, the controller 52 determines the signal S2 for controlling the duty cycle $\alpha_A$ of the switches MA1, MA2 of the first arm A so as to adjust the current flowing through the inductance L2. Voltage loops could be used. However, the current loop is easier to implement because, as a small signal, the current loop makes it possible to have a transfer function of the first order, whereas the voltage loop is of the second order. Moreover, the isolated DC/DC converter 1 could implement the first loop without using the second loop.

The isolated DC/DC converter 1 according to the invention can be designed to cover an operating range. The operating range corresponds to an input voltage Ue of the isolated DC/DC converter 1 that is between a minimum value $Ue_{min1}$ and a maximum value $Ue_{max1}$; and to an output voltage Vout that is between a minimum value $Vout_{min1}$ and a maximum value $Vout_{max1}$ By way of example, the input voltage Ue is between 170 and 450V, and the target voltage Vout at the output of the isolated DC/DC converter 1 is between 12 and 16V. By way of example, the minimum value $Vout_{min1}$ of the output voltage is between 8 and 14V and the maximum value $Vout_{max1}$ of the output voltage is between 15 and 16V.

Figure 3:
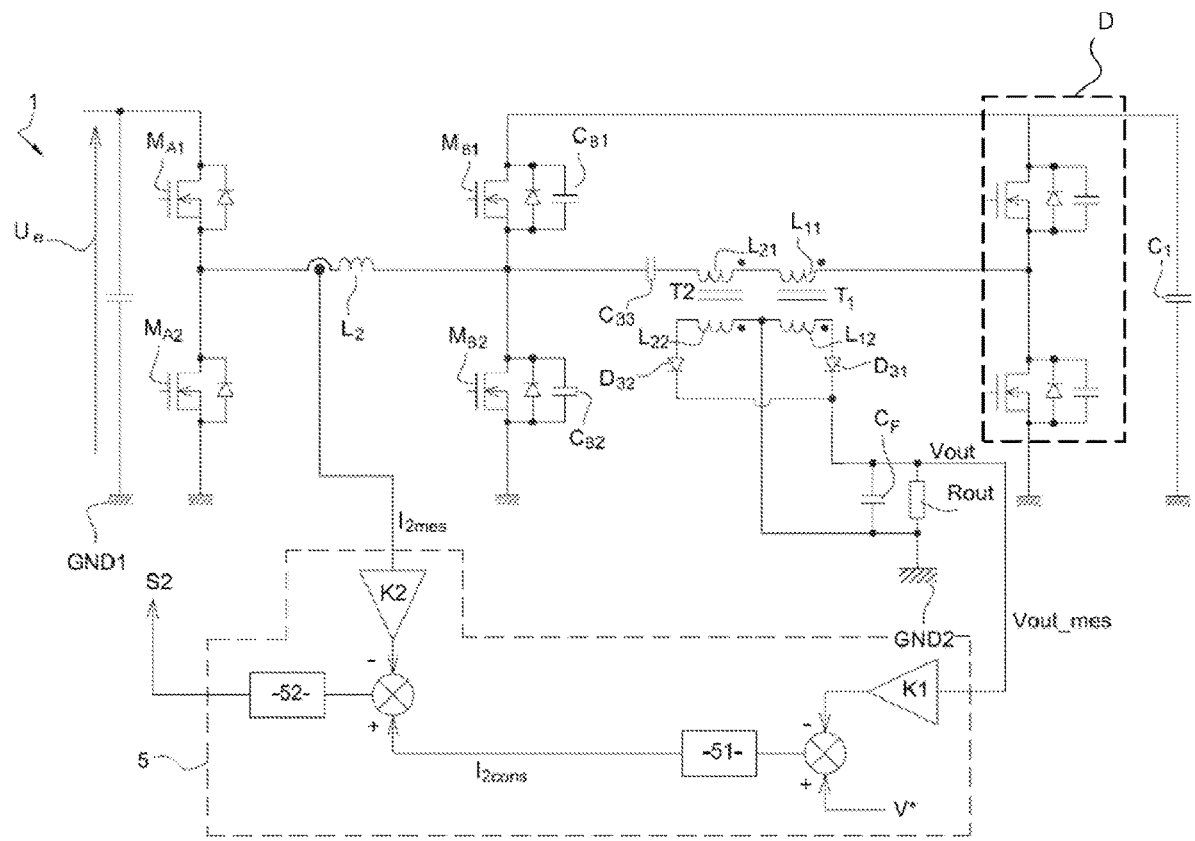
Figure 5:
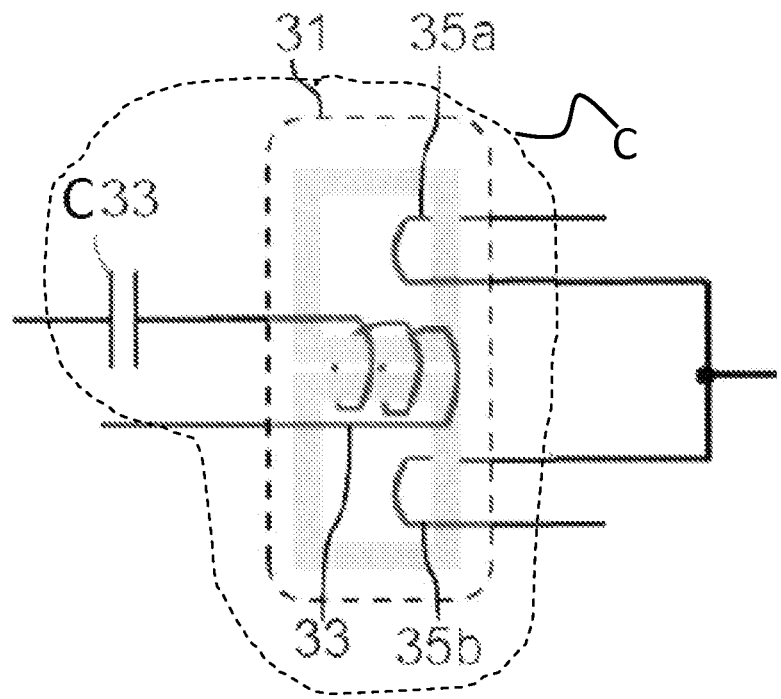
FIG. 5 illustrates a variant of the magnetic component of the converter in FIGS. 2 and 3.

In the examples illustrated in FIGS. 2 and 3, the magnetic component of the isolated DC/DC converter 1 comprises a first T1 and a second T2 transformer in series. The magnetic component may be replaced by a magnetic component 31 that is illustrated in FIG. 5. The magnetic component 31 comprises a primary circuit with a single primary winding 33 connected to the capacitance C33 and a secondary circuit with two secondary windings 35a and 35b. The two secondary windings 35a and 35b are magnetically coupled to the primary winding 33 but are not magnetically coupled to one another. Such a magnetic component 31 allows not only a reduction in the cost of the converter by reducing the number of components comprising ferrite but also a reduction in the bulk of the converter by allowing a more compact converter to be obtained.

The operation of the isolated DC/DC converter 1 remains the same. The magnetic component 31 operates in a similar manner to two perfect transformers in series. Over the first portion of the modulation period, a first portion of the primary winding 33 provides an inductance, and a second portion of the primary winding 33 transfers the energy to the second secondary winding 35a. Over the second portion of the modulation period, the first portion of the primary winding 33 transfers the energy to the first secondary 35b, and the second portion of the primary winding 33 provides an inductance.

Figure 6A:
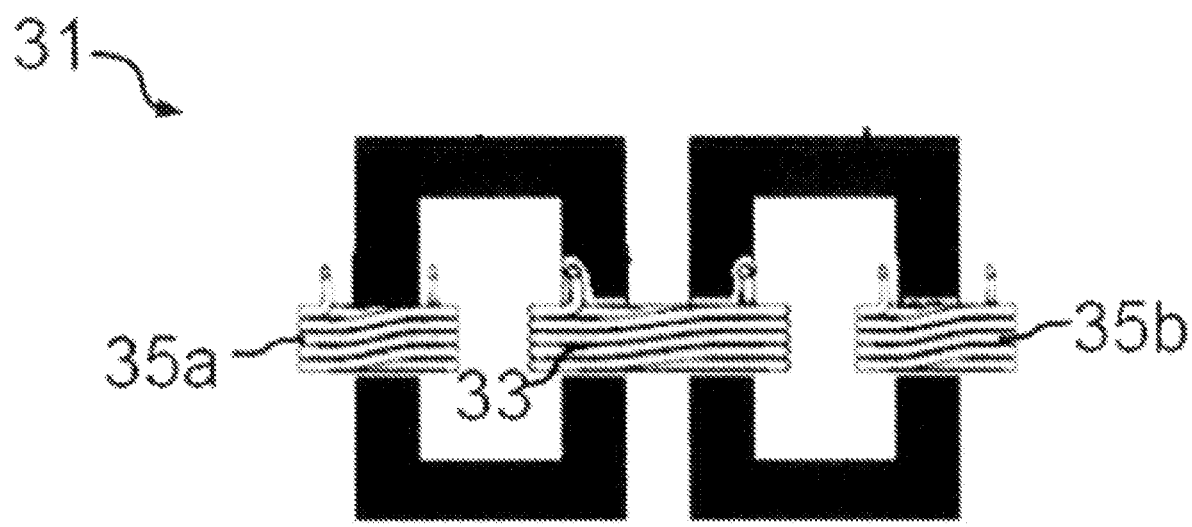
FIGS. 6a to 6e illustrate exemplary embodiments of the magnetic component illustrated in FIG. 5.
Figure 6B:
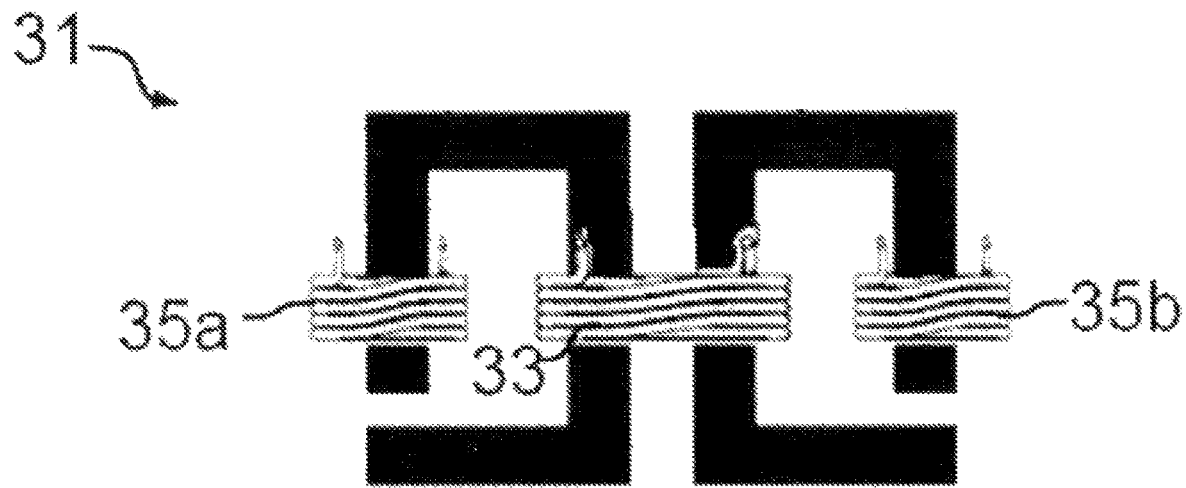
Figure 6C:
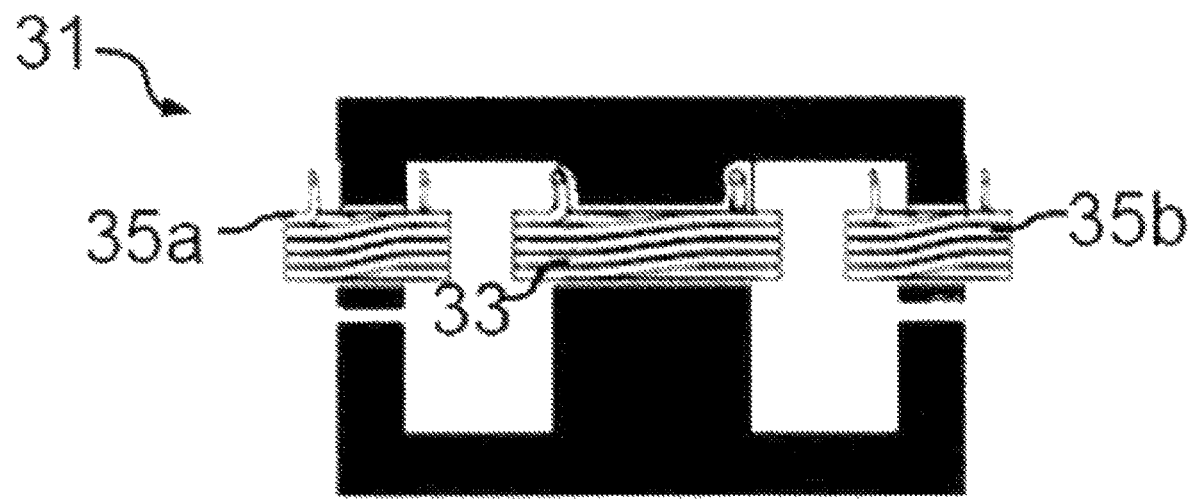

Various configurations allowing a magnetic component 31 to be obtained that allows magnetic coupling between the primary winding 33 and the secondary windings 35a and 35b without there being any magnetic coupling between the secondary windings 35a and 35b are illustrated in FIGS. 6a to 6c.

Figure 6D:
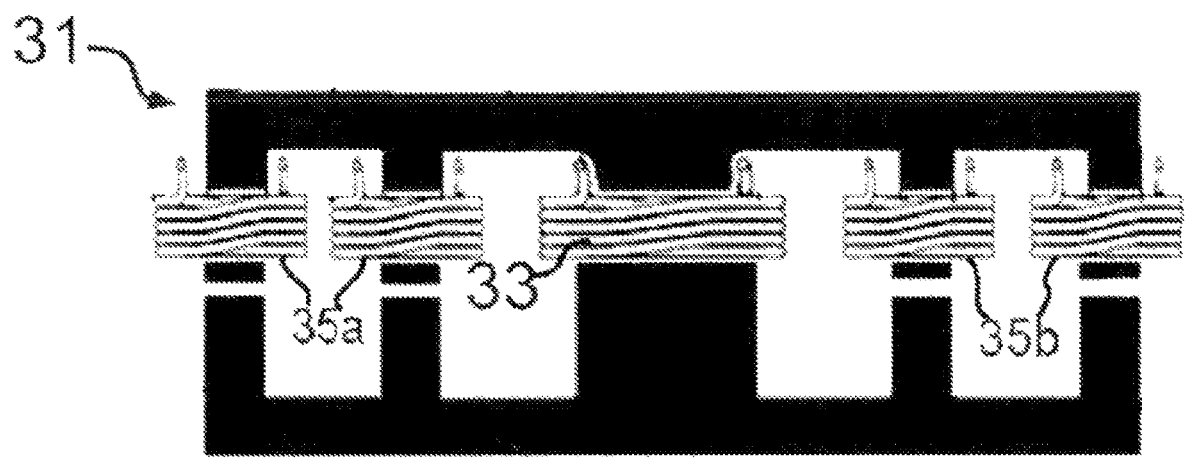
Figure 6E:
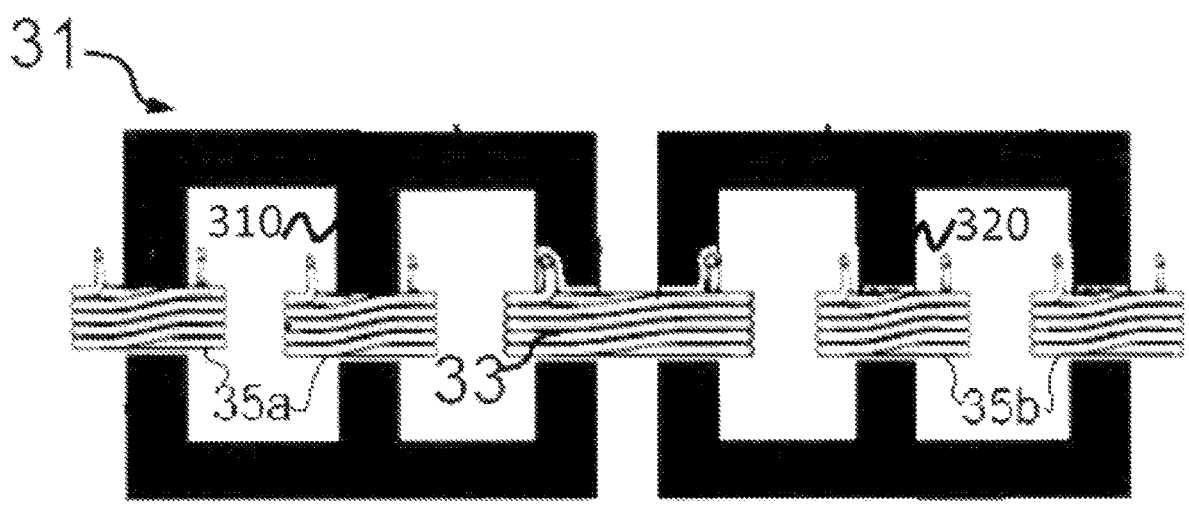

FIGS. 6d, 6e illustrate examples of a magnetic component 31 that comprise at least two first secondary windings 35a in parallel and at least two second secondary windings 35b in parallel. These configurations are advantageous in applications in which the current flowing in the isolated DC/DC converter 1 is high, for example above 100 A, or even above 200 A. The isolated DC/DC converter 1 then comprises a plurality of diodes D31, each connected to a first respective secondary winding 35a; and a plurality of diodes D32, each connected to a second respective secondary winding 35b. As in the examples illustrated in FIGS. 2 and 3, the diodes D31, D32 could be replaced with switches.

The components 31 illustrated in FIGS. 6a to 6e are described in more detail in French patent application 1458573, the content of which is incorporated in the present application.

In the example illustrated in FIG. 2, the second arm B and the primaries of the transformers T1, T2 form a half-bridge structure. The example illustrated in FIG. 3 is identical to the example in FIG. 2 except that, in FIG. 3, the second arm B and the primaries of the transformers T1, T2 form a full-bridge structure with a fourth arm D. The switches of the fourth arm D are preferably identical to those of the second arm B.

For power applications, it may be advantageous to combine a plurality of isolated DC/DC converters 1 that are illustrated in FIGS. 2 and 3. Isolated DC/DC converters 1 can be placed in parallel and combined in order to limit current ripples and reduce the value of the filtering capacitance CF at the output of the isolated DC/DC converter 1. In each isolated DC/DC converter 1, owing to the first arm A, the duty cycle $\alpha_B$ of the second arm B remains constant.

Figure 4:
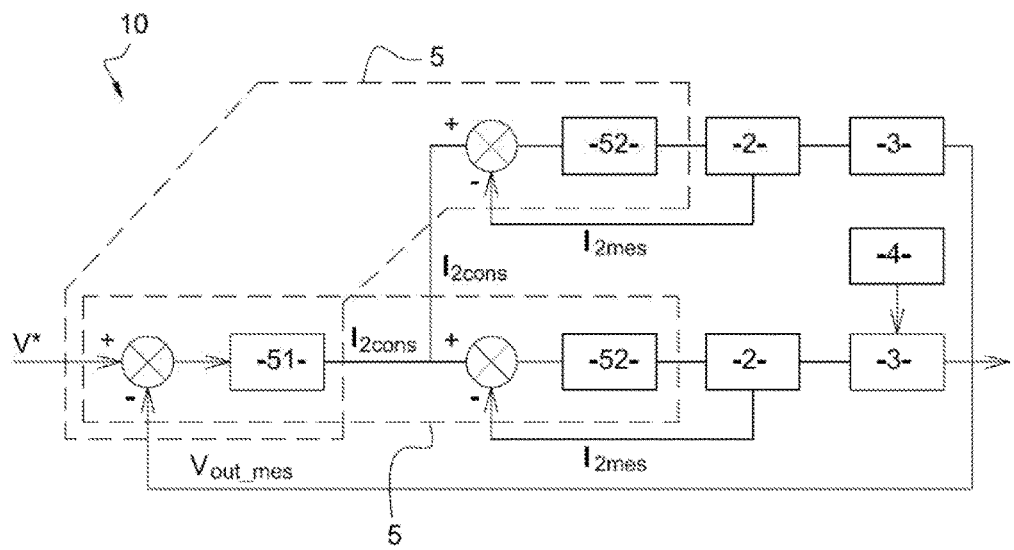
FIG. 4 illustrates an example of a method for controlling a conversion device comprising interlacing of converters according to the invention.

FIG. 4 illustrates operation of a conversion device 10 that comprises a combination of isolated DC/DC converters 1. Preferably, the first feedback loop is common to all the isolated DC/DC converters 1. Thus, the first arms A receive the same setpoint current I2cons. To this end, the device 10 can comprise a single controller 51 delivering a single setpoint current I2cons to all the first arms A of the isolated DC/DC converters 1. Thus, current balancing between the converters is ensured.

Preferably, the isolated DC/DC converters 1 operate with a phase shift. In particular, the first arms A operate with a phase shift of $2\pi/n$, where n is the number of isolated DC/DC converters 1, which allows fluctuations of the output of the device 10 and electromagnetic compatibility problems to be limited. The second arms B of the isolated DC/DC converters 1 operate with a phase shift of $\pi/n$, which allows ripples at the output of the device 10 to be limited. These ripples can be caused by parasitic elements, such as primary-side or secondary-side parasitic inductances.

The invention is not limited to the examples described. In particular, the voltage loops can be replaced by current loops. The isolated DC/DC converter can also be used in an AC/DC converter that is configured to convert an AC voltage into a DC voltage or vice versa, or in an AC/AC converter. Advantageously, the isolated DC/DC converter is then complemented by an AC/DC converter upstream of the first arm and/or a DC/AC converter downstream of the isolated DC/DC converter.

The invention claimed is:

1. An isolated DC/DC converter comprising:
    a first arm comprising switches in series, the first arm being connected to the input of the converter;
    a second arm comprising switches in series;
    an inductor connected between the centre points of the first and the second arm, and having a first terminal directly connected to the centre point of the two switches of the first arm and a second terminal directly connected to the centre point of the second arm;
    a capacitor connected between the end terminals of the second arm, said capacitor being connected to a high-side switch of the second arm and to the low-side switch of the second arm, at a respective terminal that is different from the centre point of the second arm;
    a third arm comprising a magnetic component, the third arm being connected to the centre point of the second arm;
    in which successions of opening and closing operations of the switches allow an input voltage to be converted into an output voltage by means of the magnetic component.

2. The converter according to claim 1, in which the first arm is configured to control the output voltage of the isolated DC/DC converter by modifying an electrical parameter of a signal flowing through the inductor, the duty cycle of the second arm remaining constant.

3. The converter according to claim 2, in which the second arm is configured so that its duty cycle is equal to 50%.

4. The converter according to claim 1, comprising a circuit that is configured to implement a first loop so as to control a setpoint for an electrical parameter of a signal flowing through the inductor connected between the first and second arms according to a difference between the value of the output voltage of the isolated DC/DC converter and a setpoint output voltage for the isolated DC/DC converter.

5. The converter according to claim 1, in which the magnetic component has a primary circuit and a secondary circuit that are separated by an electrical isolation barrier, said magnetic component being configured so as, during the conversion of an input voltage of the isolated DC/DC converter into an output voltage, to operate as a transformer from the primary circuit to the secondary circuit and as an impedance that stores energy in the primary circuit.

6. The converter according to claim 5, in which the magnetic component is configured so that:
    over a first portion of an operating period of the converter, a first portion of the primary circuit transfers an energy to a first portion of the secondary circuit and a second portion of the primary circuit provides an inductance storing energy;
    over a second portion of the operating period of the converter, the second portion of the primary circuit transfers an energy to a second portion of the secondary circuit, and the first portion of the primary circuit provides an inductance storing energy.

7. The converter according to claim 5, in which the primary circuit of the magnetic component comprises a primary winding and the secondary circuit of the magnetic component comprises at least one first secondary winding and at least one second secondary winding that are not magnetically coupled to one another, said first and second secondary windings being magnetically coupled to the primary winding.

8. The converter according to claim 7, in which the magnetic component is configured to act as a transformer from the primary winding, either to the first secondary winding(s) or to the second secondary winding(s); while operating as an impedance that stores energy in the primary winding.

9. The converter according to claim 6, in which the magnetic component comprises at least a first and a second transformer in series, in which transformers:
the primary of the first transformer forms the first portion of the primary circuit and the secondary of the first transformer forms the first portion of the secondary circuit;
the primary of the second transformer forms the second portion of the primary circuit and the secondary of the second transformer forms the second portion of the secondary circuit.

10. A device for converting voltage comprising a combination of a number n of isolated DC/DC converters, n being an integer greater than or equal to 2, each of the isolated DC/DC converters comprising:
a first arm comprising switches in series, the first arm being connected to the input of the converter;
a second arm comprising switches in series;
an inductor connected between the centre points of the first and the second arm, and having a first terminal directly connected to the centre point of the two switches of the first arm and a second terminal directly connected to the centre point of the second arm;
a capacitor connected between the end terminals of the second arm, said capacitor being connected to a high-side switch of the second arm and to the low-side switch of the second arm, at a respective terminal that is different from the centre point of the second arm;
a third arm comprising a magnetic component, the third arm being connected to the centre point of the second arm;
in which successions of opening and closing operations of the switches allow an input voltage to be converted into an output voltage by means of the magnetic component; and
in which the first respective arms of the isolated DC/DC converters are configured to operate with a phase shift of $2\pi/n$, and the second respective arms of the converters are configured to operate with a phase shift of $\pi/n$.

11. The device according to claim 10, in which the isolated DC/DC converters share a single circuit that is configured to implement a first loop so as to control a setpoint for an electrical parameter of a signal flowing through the inductor connected between the first and second arms according to a difference between the value of the output voltage of the isolated DC/DC converter and a setpoint output voltage for the isolated DC/DC converter, so that the first respective arms of the isolated DC/DC converters receive the same setpoint.

12. A method for converting voltage comprising the steps of:
providing at least one isolated DC/DC converter comprising:
a first arm comprising switches in series, the first arm being connected to the input of the converter;
a second arm comprising switches in series;
an inductor connected between the centre points of the first and the second arm and having a first terminal directly connected to the centre point of the two switches of the first arm and a second terminal directly connected to the centre point of the second arm;
a capacitor connected between the end terminals of the second arm, said capacitor being connected to a high-side switch of the second arm and to the low-side switch of the second arm, at a respective terminal that is different from the centre point of the second arm;
a third arm comprising a magnetic component, the third arm being connected to the centre point of the second arm;
performing successions of opening and closing operations of the switches allowing an input voltage to be converted into an output voltage by means of the magnetic component of the isolated DC/DC converter.

13. The method according to claim 12, in which the performance of the successions of opening and closing operations of the switches comprises modification of an electrical parameter of a signal flowing through the inductor, the duty cycle of the second arm remaining constant.

14. The method according to claim 13, in which the duty cycle of the second arm is equal to 50%.

15. The method according to claim 12, in which the conversion of the input voltage into an output voltage comprises a first loop controlling the setpoint of an electrical parameter of a signal flowing through the first arm according to a difference between the value of the output voltage of the isolated DC/DC converter and a setpoint output voltage for the isolated DC/DC converter.

16. The method according to claim 12 comprising:
a provision of a number n of isolated DC/DC converters, n being an integer greater than or equal to 2; and in which:
the second respective arms of the isolated DC/DC converters operate with a phase shift of $\pi/n$; and
the first respective arms of the isolated DC/DC converters operate with a phase shift of $2\pi/n$.

17. The method according to claim 16, in which the conversion of the input voltage into an output voltage is performed with a common setpoint delivered by a single first arm that is shared between the isolated DC/DC converters.

18. The converter according to claim 2, comprising a circuit that is configured to implement a first loop so as to control a setpoint for an electrical parameter of a signal flowing through the inductor connected between the first and second arms according to a difference between the value of the output voltage of the isolated DC/DC converter and a setpoint output voltage for the isolated DC/DC converter.

19. The converter according to claim 4, in which the magnetic component has a primary circuit and a secondary circuit that are separated by an electrical isolation barrier, said magnetic component being configured so as, during the conversion of an input voltage of the isolated DC/DC converter into an output voltage, to operate as a transformer from the primary circuit to the secondary circuit and as an impedance that stores energy in the primary circuit.

20. The converter according to claim 6, in which the primary circuit of the magnetic component comprises a primary winding and the secondary circuit of the magnetic component comprises at least one first secondary winding and at least one second secondary winding that are not magnetically coupled to one another, said first and second secondary windings being magnetically coupled to the primary winding.

* * * * *